(12) United States Patent
Lin et al.

(10) Patent No.: US 10,978,339 B2
(45) Date of Patent: Apr. 13, 2021

(54) METAL INTERCONNECT STRUCTURE AND METHOD FOR FABRICATING THE SAME

(71) Applicant: UNITED MICROELECTRONICS CORP., Hsin-Chu (TW)

(72) Inventors: Da-Jun Lin, Kaohsiung (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 25 days.

(21) Appl. No.: 16/011,615

(22) Filed: Jun. 18, 2018

(65) Prior Publication Data

US 2019/0355618 A1 Nov. 21, 2019

(30) Foreign Application Priority Data

May 21, 2018 (TW) .................. 107117189

(51) Int. Cl.
*H01L 21/768* (2006.01)
*H01L 23/522* (2006.01)
*H01L 23/532* (2006.01)

(52) U.S. Cl.
CPC .... *H01L 21/76858* (2013.01); *H01L 21/7684* (2013.01); *H01L 21/76802* (2013.01); *H01L 21/76846* (2013.01); *H01L 21/76877* (2013.01); *H01L 23/5226* (2013.01); *H01L 23/53238* (2013.01)

(58) Field of Classification Search
CPC ......... H01L 21/76843; H01L 21/76847; H01L 21/7685; H01L 21/7684; H01L 21/76858
See application file for complete search history.

(56) References Cited

U.S. PATENT DOCUMENTS

| 9,607,888 | B2 | 3/2017 | Yu et al. | |
| 2007/0284736 | A1* | 12/2007 | Yang | H01L 21/76844 257/734 |
| 2011/0017499 | A1* | 1/2011 | Yang | H01L 21/76846 174/257 |
| 2017/0092589 | A1* | 3/2017 | Chen | H01L 23/53238 |

FOREIGN PATENT DOCUMENTS

CN 103623837 3/2014

* cited by examiner

*Primary Examiner* — Zandra V Smith
*Assistant Examiner* — John M Parker
(74) *Attorney, Agent, or Firm* — Winston Hsu

(57) ABSTRACT

A method for fabricating semiconductor device includes the steps of: forming a dielectric layer on a substrate; forming a trench in the dielectric layer; forming a first liner in the trench, wherein the first liner comprises Co—Ru alloy; forming a metal layer on the first liner; and planarizing the metal layer and the first liner to form a metal interconnection.

11 Claims, 4 Drawing Sheets

METAL INTERCONNECT STRUCTURE AND METHOD FOR FABRICATING THE SAME

BACKGROUND OF THE INVENTION

1. Field of the Invention

The invention relates to a method for fabricating metal interconnect structure, and more particularly to a method for fabricating metal interconnect structure containing cobalt (Co) and ruthenium (Ru) alloy (Co—Ru alloy).

2. Description of the Prior Art

As device dimensions continue to shrink, a reduction in interconnect line widths leads to increased line resistance (R) for signals. Further, reduced spacing between conducting lines creates more parasitic capacitance (C). The result is an increase in RC signal delay, which slows chip speed and lowers chip performance.

The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the ULSI technology. For this reason, prior art attempts to reduce the RC delays have focused on utilizing material with a low-k to fill the gaps between the metal lines.

Silicon dioxide ($SiO_2$) has been conventionally preferred as a dielectric material even though it has a relatively high dielectric constant (relative to vacuum) of about 4.1 to 4.5 because it is a thermally and chemically stable material and conventional oxide etching techniques are available for high-aspect-ratio contacts and via holes. However, as device dimensions decrease and the packing density increases, it is necessary to reduce the spacing between conductive lines to effectively wire up the integrated circuits. Therefore, a large number of lower dielectric constant materials are currently being investigated to reduce the RC value of the chip further. These include among many others fluorinated $SiO_2$, aerogels, and polymers. Another method being proposed to lower the dielectric constant even further is to form air gaps between the interconnect lines. While silicon dioxide has a dielectric constant of about 4 and greater, the dielectric constant of air is about 1.

Although air is the best dielectric material for lowering the RC value, unfortunately the use of air gap structures in integrated circuit fabrication has been hindered with problems. Overall mechanical strength of the device is reduced correspondingly and lead to structural deformation and a weakened structure can have serious effect in various aspects of subsequent integrated circuit fabrication. Accordingly, what is needed in the art is a novel interconnect structure and method of manufacture thereof that addresses the above-discussed issues.

SUMMARY OF THE INVENTION

According to an embodiment of the present invention, a method for fabricating semiconductor device includes the steps of: forming a dielectric layer on a substrate; forming a trench in the dielectric layer; forming a first liner in the trench, wherein the first liner comprises Co—Ru alloy; forming a metal layer on the first liner; and planarizing the metal layer and the first liner to form a metal interconnection.

According to another aspect of the present invention, a semiconductor device includes a metal interconnection in a dielectric layer, in which the metal interconnection further includes a first liner comprising Co—Ru alloy and a metal layer on the liner.

According to an embodiment of the present invention, a barrier layer made of titanium nitride (TiN) is disposed between the dielectric layer and the first liner.

According to an embodiment of the present invention, a second liner is disposed between the barrier layer and the first liner and a third liner is disposed between the first liner and the metal layer, in which the second liner and the third liner could include different thicknesses or same thickness, the second liner and the third liner are selected from the group consisting of cobalt (Co) and ruthenium (Ru), and the metal layer comprises copper (Cu).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
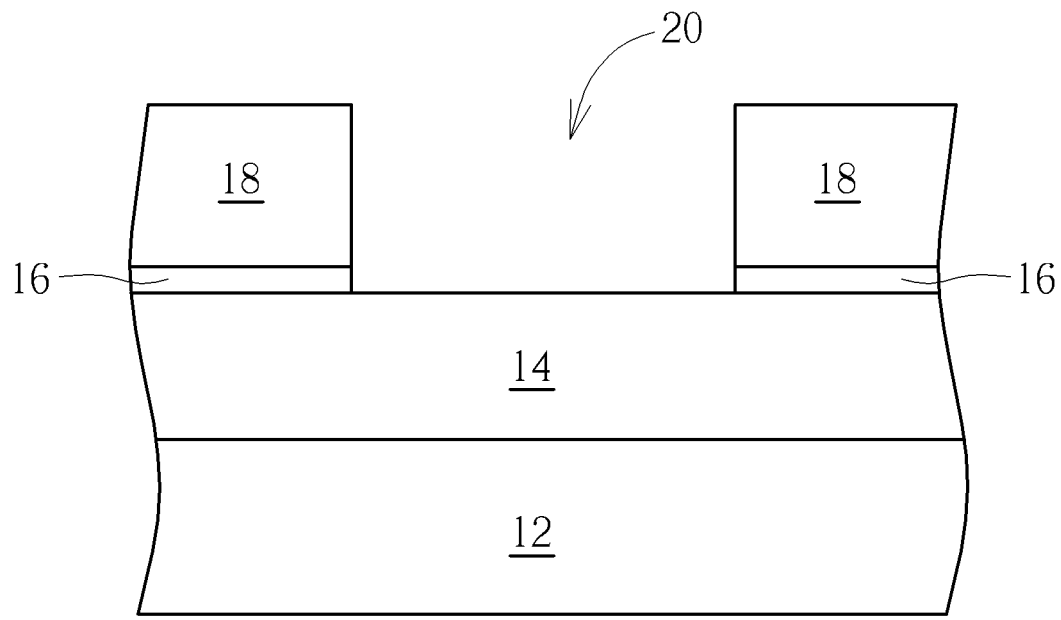
FIGS. 1-4 illustrate a method for fabricating metal interconnect structure according to an embodiment of the present invention.

Referring to FIGS. 1-4, FIGS. 1-4 illustrate a method for fabricating metal interconnect structure according to an embodiment of the present invention. As shown in FIG. 1, a substrate 12, such as a substrate composed of semiconductor material is provided, in which the semiconductor material could be selected from the group consisting of silicon, germanium, silicon germanium compounds, silicon carbide, and gallium arsenide. Active devices such as metal-oxide semiconductor (MOS) transistors, passive devices, conductive layers, and interlayer dielectric (ILD) layer 14 could also be formed on top of the substrate 12.

More specifically, planar MOS transistors or non-planar (such as FinFETs) MOS transistors could be formed on the substrate 12, in which the MOS transistors could include transistor elements such as metal gates and source/drain region, spacer, epitaxial layer, contact etch stop layer (CESL), the ILD layer 14 could be formed on the substrate 12 and covering the MOS transistors, and a plurality of contact plugs could be formed in the ILD layer 14 to electrically connect to the gate and/or source/drain region of MOS transistors. Since the fabrication of planar or non-planar transistors and ILD layer 14 is well known to those skilled in the art, the details of which are not explained herein for the sake of brevity.

Next, a selective stop layer 16 and a dielectric layer 18 are formed on the ILD layer 14, and a photo-etching process is conducted to remove part of the dielectric layer 18 and part of the stop layer 16 to form a trench 20 in the dielectric layer 18 and stop layer 16 for exposing the surface of the ILD layer 14 or contact plugs or conductive lines embedded within the ILD layer 14. In this embodiment, the stop layer 16 could include dielectric material such as but not limited to for example silicon nitride (SiN) or silicon carbon nitride (SiCN) and the dielectric layer 18 is preferably a ultra low-k (ULK) dielectric layer.

Figure 2:
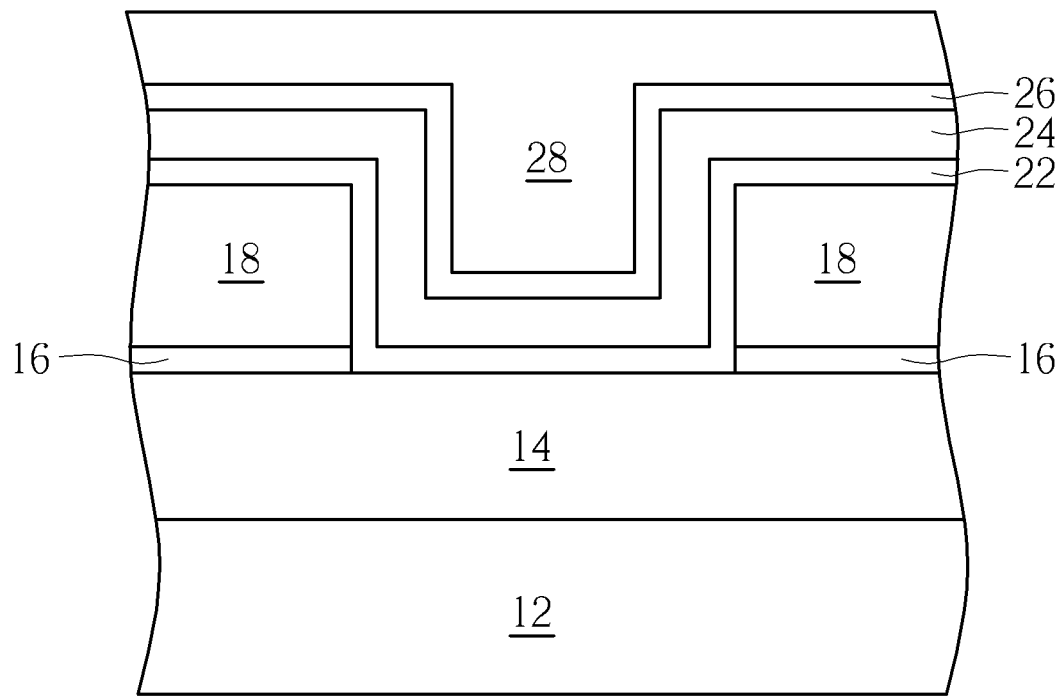

Next, as shown in FIG. 2, a barrier layer 22 is formed in the trench 20, and a deposition process such as chemical vapor deposition (CVD) process, a physical vapor deposition (PVD) process, or an atomic layer deposition (ALD) process is conducted to sequentially form a liner 24, a liner 26, and a metal layer 28 on the barrier layer 22 to fill the trench 20. In this embodiment, the barrier layer 22 could be selected from the group consisting of titanium (Ti), titanium nitride (TiN), tantalum (Ta), and tantalum nitride (TaN) and most preferably TiN, and the metal layer 28 could be selected from the group consisting of tungsten (W), copper (Cu), aluminum (Al), titanium aluminide (TiAl) alloy, and cobalt tungsten phosphide (CoWP) and most preferably Cu. It should be noted that the thickness of the lower liner 24 is preferably greater than the thickness of the upper liner 26 and a combined thickness of the lower liner 24 and the upper liner 26 is preferably between 0.1 Angstroms to 100 Angstroms, the liner 24 and the liner 26 are preferably made of different materials while both layers could be selected from the group consisting of cobalt (Co) and ruthenium (Ru).

Figure 3:
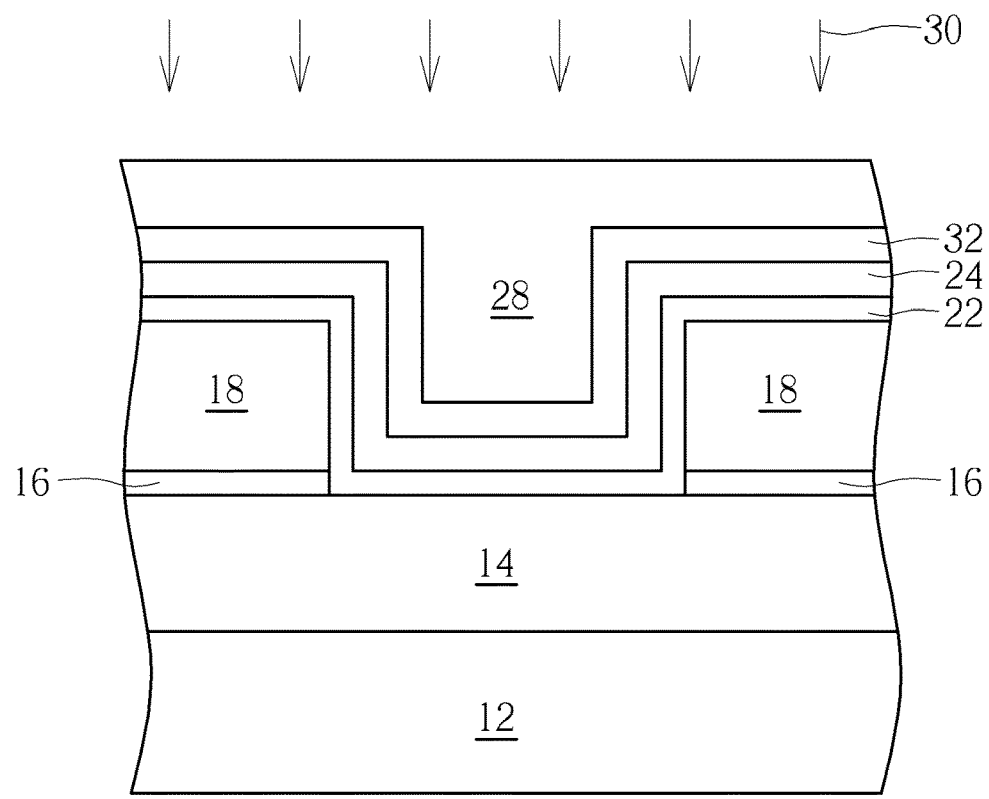

Next, as shown in FIG. 3, a thermal treatment or anneal process 30 is conducted by using a temperature preferably between 25° C. to 400° C. to transform the liner 24 and the liner 26 into a liner 32. Specifically, the anneal process 30 conducted at this stage preferably combines the upper liner 26 and part of the lower liner 24 into a newly formed liner 32, in which all of the upper liner 26 is preferably consumed and transformed during the anneal process 30 and replaced by the new liner 32 so that the new liner 32 is then disposed on top of the remaining lower liner 24. For instance, if the lower and thicker liner 24 were made of Ru while the upper and thinner liner 26 were made of Co, all of the liner 26 made of Co would combine with part of the liner 24 made of Ru during and/or after the anneal process 30 to form a liner 32 made of Co—Ru alloy and disposed on top of the remaining liner 24. Since part of the lower liner 24 is consumed during the anneal process 30 and transformed into the new liner 32, the thickness of the remaining lower liner 24 after forming the new liner 32 is preferably equal to the thickness of the new liner 32.

Nevertheless, instead of using the combination of materials disclosed above, according to an embodiment of the present invention, it would also be desirable to switch or exchange the materials of the liners 24, 26. For instance, if the lower and thicker liner 24 were made of Co while the upper and thinner liner 26 were made of Ru, all of the liner 26 made of Ru would combine with part of the liner 24 made of Co during and/or after the anneal process 30 to form a liner 32 made of Co—Ru alloy and disposed on top of the remaining liner 24 made of Co. Since part of the lower liner 24 made of Co is consumed during the anneal process 30 and transformed into the new liner 32, the thickness of the remaining lower liner 24 after forming the new liner 32 is preferably equal to the thickness of the new liner 32 made of Co—Ru alloy, which is also within the scope of the present invention.

According to yet another embodiment of the present invention, in contrast to forming a thicker liner 24 and a thinner liner 26 as disclosed in the embodiment shown in FIG. 2, it would also be desirable to switch the thickness of the liners 24, 26 by forming a thinner 24 and then a thicker liner 26 on the barrier layer 22, in which a combined thickness of the lower liner 24 and the upper liner 26 is preferably between 0.1 Angstroms to 100 Angstroms and the liners 24, 26 are made of different materials while the liners 24, 26 could be selected from the group consisting of Co and Ru. Next, an anneal process 30 similar to the one shown in FIG. 3 could be conducted to form a liner 32 on the remaining liner 24 as the thickness of the liner 32 is substantially the same as the thickness of the remaining liner 24, which is also within the scope of the present invention.

Figure 4:
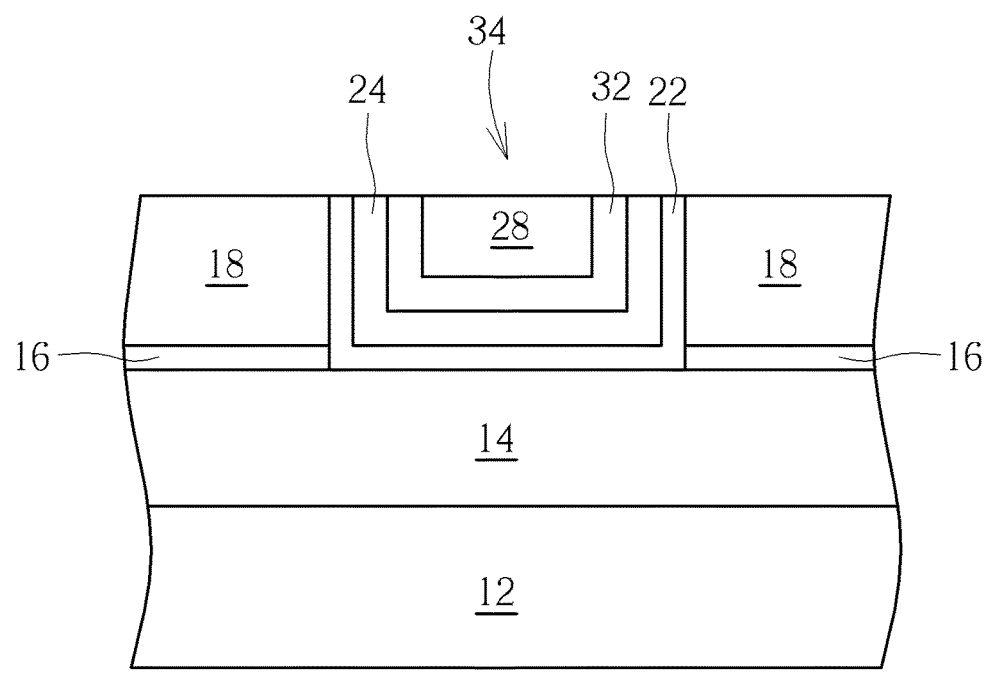

Next, as shown in FIG. 4, a planarizing process such as a chemical mechanical polishing (CMP) process is conducted to remove part of the metal layer 28, part of the liner 32, part of the liner 24, and part of the barrier layer 22 to form a conductor or more specifically a metal interconnection 34 in the trench 20, in which a top surface of the metal interconnection 34 is preferably even with a top surface of the dielectric layer 18. It should be noted that conductor or metal interconnection 34 in this embodiment could be a single damascene structure or a dual damascene structure such as a trench conductor, a via conductor, or a combination of both, in which a bottom surface of the metal interconnection 34 is preferably connected to or directly contacting a conductive plug (not shown) or conductive wire originally embedded within the ILD layer 14 so that the metal interconnection 34 could be electrically connected to an active device such as source/drain region or gate structure of the aforementioned MOS transistor disposed on the substrate 12. The top surface of the metal interconnection 34 on the other hand could be connected other metal interconnections such as contact pad or other circuits through follow-up metal interconnective process depending on the demand of the product. This completes the fabrication of a semiconductor device or metal interconnect structure according to an embodiment of the present invention.

Figure 5:
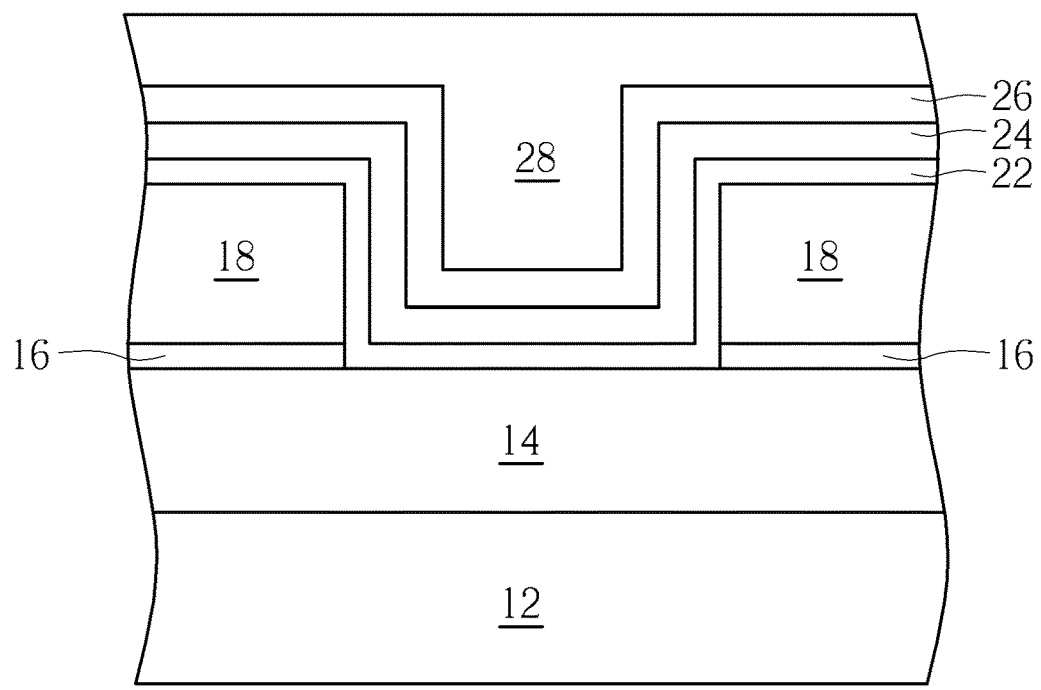
FIGS. 5-7 illustrate a method for fabricating metal interconnect structure according to an embodiment of the present invention.
Figure 6:
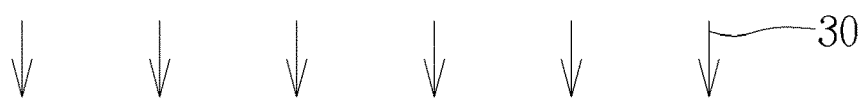
Figure 6:
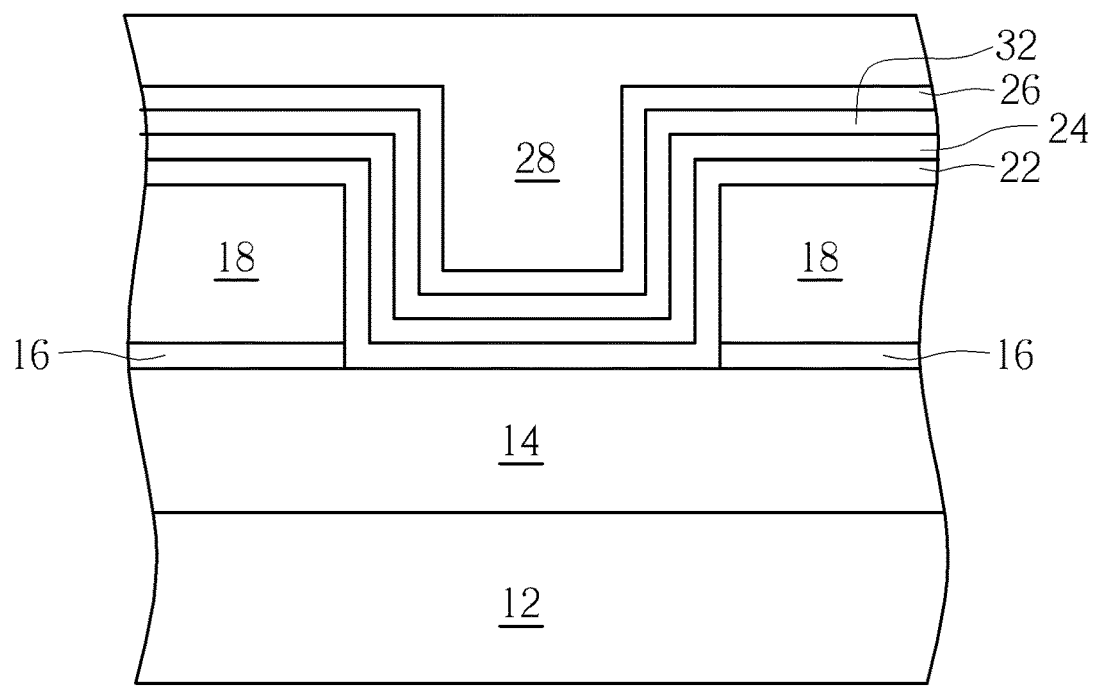
Figure 7:
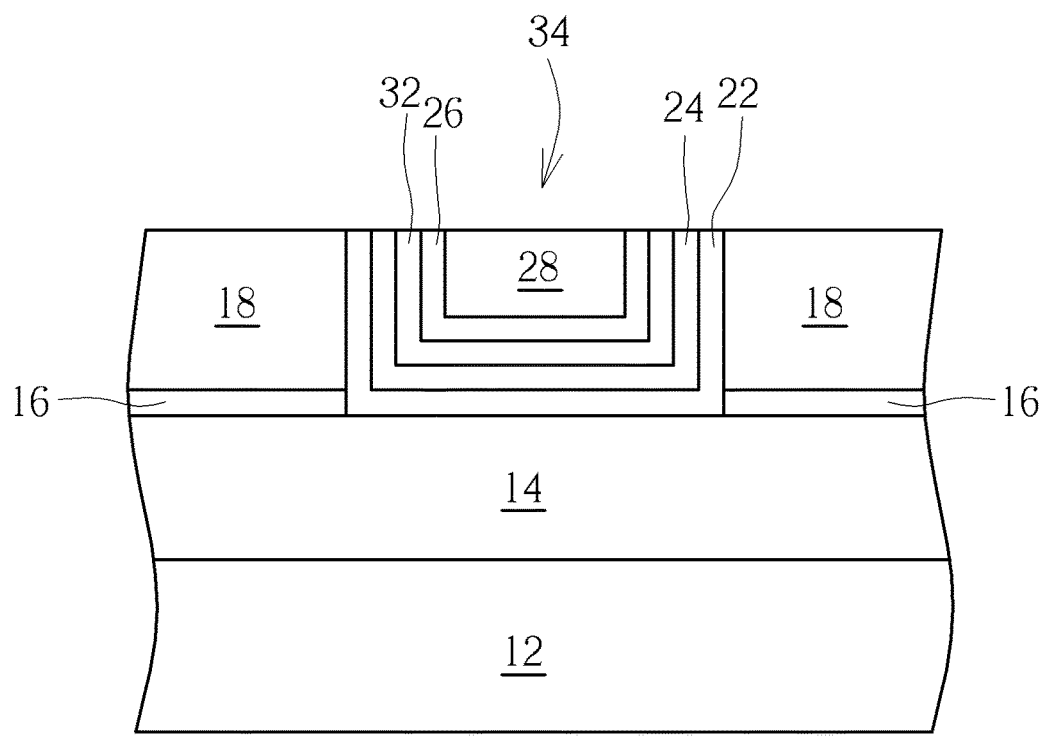

Referring to FIGS. 5-7, FIGS. 5-7 illustrate a method for fabricating metal interconnect structure according to an embodiment of the present invention. As shown in FIG. 5, it would be desirable to follow the process shown in FIGS. 1-2 by first forming a trench in the stop layer 16 and the dielectric layer 18 and then sequentially forming the barrier layer 20, the liner 24, the liner 26, and the metal layer 28 on the dielectric layer 18 to fill the trench 20 completely.

In contrast to the liners 24, 26 in the aforementioned embodiment having different thicknesses, the liners 24, 26 in this embodiment preferably share same thickness, in which a combined thickness of the two liners 24, 26 is preferably between 0.1 Angstroms to 100 Angstroms and the liners 24, 26 are preferably made of different materials while both layers could be selected from the group consisting of cobalt (Co) and ruthenium (Ru).

Next, as shown in FIG. 6, a thermal treatment or anneal process 30 is conducted by using a temperature preferably between 25° C. to 400° C. to transform the liner 24 and the liner 26 into a liner 32. It should be noted that since the liners 24, 26 in this embodiment share same thickness, the thermal treatment process 30 conducted at this stage preferably combine part of the liner 24 and part of the liner 26 closer or adjacent to the junction between the upper liner 26 and the lower liner 24 into a new liner 32. In other words, the new liner 32 is formed by transforming part of the liner 24 and part of the liner 26 at the same time and disposed between the original liners 24 and 26. In this embodiment, if the original lower liner 24 were made of Ru and the upper liner 26 were made of Co, part of the liner 26 made of Co and part of the liner 24 made of Ru would be combined to form a liner 32 made of Co—Ru alloy after the anneal process 30 and the liner 32 would be disposed between the remaining liners 24, 26. Since the original upper liner 26 and the lower liner 24 were having equal thickness, the thickness of the remaining lower liner 24 is preferably the same as the thickness of the remaining upper liner 26 and the thickness of the new liner 32.

In addition to the combination of materials disclosed in the above embodiment, according to an embodiment of the present invention, it would also be desirable to switch the materials of the liners 24, 26. For instance, if the lower liner 24 were made of Co and the upper liner 26 were made of Ru, part of the liner 24 made of Co and part of the liner 26 made of Ru would be combined to form an liner 32 made of Co—Ru alloy disposed between the liner 24 and the liner 26 after the anneal process 30, which is also within the scope of the present invention.

Next, as shown in FIG. 7, a planarizing process such as a chemical mechanical polishing (CMP) process is conducted to remove part of the metal layer 28, part of the liner 26, part of the liner 32, part of the liner 24, and part of the barrier layer 22 to form a conductor or more specifically a metal interconnection 34 in the trench 20, in which a top surface of the metal interconnection 34 is preferably even with a top surface of the dielectric layer 18. Similar to the aforementioned embodiment, the conductor or metal interconnection 34 in this embodiment could be a single damascene structure or a dual damascene structure such as a trench conductor, a via conductor, or a combination of both, in which a bottom surface of the metal interconnection 34 is preferably connected to or directly contacting a conductive plug (not shown) or conductive wire originally embedded within the ILD layer 14 so that the metal interconnection 34 could be electrically connected to an active device such as source/drain region or gate structure of the aforementioned MOS transistor disposed on the substrate 12. The top surface of the metal interconnection 34 on the other hand could be connected other metal interconnections such as contact pad or other circuits through follow-up metal interconnective process depending on the demand of the product. This completes the fabrication of a semiconductor device or metal interconnect structure according to an embodiment of the present invention.

Figure 8:
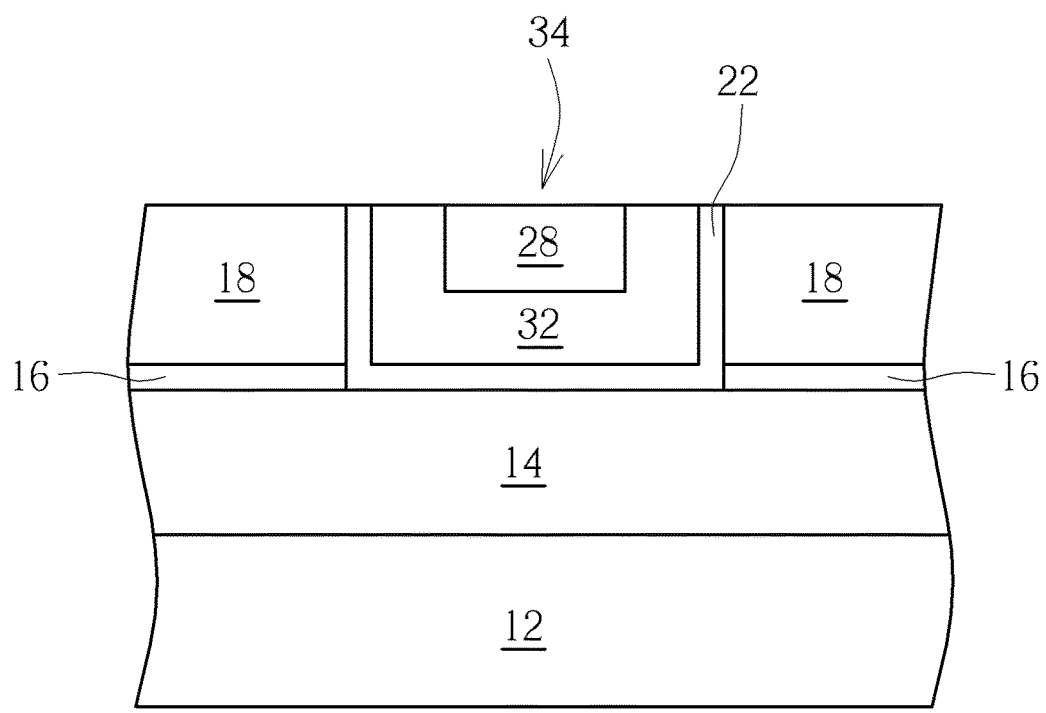
FIG. 8 illustrates a structural view of a metal interconnect structure according to an embodiment of the present invention.

Referring to FIG. 8, FIG. 8 illustrates a structural view of a metal interconnect structure according to an embodiment of the present invention. As shown in FIG. 8, in contrast to forming two or three layers of liners between the metal layer 28 and the barrier layer 22, it would be desirable to extend the duration of the anneal process 30 conducted in FIG. 3 and FIG. 6 so that all of the liner only made of Ru and the liner only made of Co would be completely consumed and transformed into the liner 32 made of Co—Ru alloy.

In other words, in contrast to not only having the liner 32 made of Co—Ru alloy between the metal layer 28 and the barrier layer 22 but also individual liners only made of Ru and Co, only a single liner 32 made of Co—Ru alloy is disposed between the metal layer 28 and the liner 22 in this embodiment while the liner 32 directly contacts the barrier layer 22 and the metal layer 28 at the same time.

Overall, the present invention preferably forms a liner made of Co—Ru alloy between a barrier layer made of TiN and a metal layer made of copper during a process for fabricating metal interconnect structures, in which the liner could be a single-layered structure or multi-layered structure depending on the demand of the product. According to a preferred embodiment of the present invention, the presence of the liner could be used to prevent formation of divots or cavities between the liner and the copper metal layer thereby improving the smoothness of the overall interconnect structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a metal interconnection in a dielectric layer, wherein the metal interconnection comprises:
a first liner is made of Co—Ru alloy;
a barrier layer between the dielectric layer and the first liner;
a second liner between the barrier layer and the first liner, wherein the second liner directly contacts the first liner and the barrier layer entirely, each of the first liner, the barrier layer, and the second liner comprises a U-shape and the second liner is made of cobalt (Co); and
a metal layer on the first liner.

2. The semiconductor device of claim 1, wherein the barrier layer comprises titanium nitride (TiN).

3. The semiconductor device of claim 1, further comprising a third liner between the first liner and the metal layer.

4. The semiconductor device of claim 3, wherein the second liner and the third liner comprise different thicknesses.

5. The semiconductor device of claim 3, wherein the second liner and the third liner comprise same thickness.

6. The semiconductor device of claim 3, wherein the third liner is made of ruthenium (Ru).

7. The semiconductor device of claim 1, wherein the metal layer comprises copper (Cu).

8. The semiconductor device of claim 1, wherein an entire bottom surface of the second liner directly contacts an entire top surface of the barrier layer and an entire top surface of the second liner directly contacts an entire bottom surface of the first liner.

9. A semiconductor device, comprising: a metal interconnection in a dielectric layer, wherein the metal interconnection comprises:
a first liner is made of Co—Ru alloy;
a barrier layer between the dielectric layer and the first liner;
a second liner between the barrier layer and the first liner, wherein the second liner directly contacts the first liner and the barrier layer entirely and the second liner is made of cobalt (Co);
a metal layer on the first liner; and
a third liner between the first liner and the metal layer, wherein the third liner directly contacts the first liner and the metal layer entirely and the third liner is made of ruthenium (Ru).

10. The semiconductor device of claim 9, wherein an entire bottom surface of the second liner directly contacts an entire top surface of the barrier layer and an entire top surface of the second liner directly contacts an entire bottom surface of the first liner.

11. The semiconductor device of claim 9, wherein an entire bottom surface of the third liner directly contacts an entire top surface of the first liner and an entire top surface of the third liner directly contacts an entire bottom surface of the metal layer.

* * * * *